United States Patent
Yoshida et al.

(10) Patent No.: US 11,597,879 B2
(45) Date of Patent: Mar. 7, 2023

(54) WAVELENGTH CONVERTER AND LIGHT EMITTING DEVICE

(71) Applicant: NICHIA CORPORATION, Anan (JP)

(72) Inventors: Shigeki Yoshida, Anan (JP); Hiroyuki Watanabe, Itano-gun (JP); Eri Matsuka, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/449,340

(22) Filed: Sep. 29, 2021

(65) Prior Publication Data
US 2022/0098483 A1 Mar. 31, 2022

(30) Foreign Application Priority Data

Sep. 30, 2020 (JP) .............................. JP2020-165313
May 25, 2021 (JP) .............................. JP2021-087486

(51) Int. Cl.
*C09K 11/77* (2006.01)
*H01L 33/50* (2010.01)
*C09K 11/02* (2006.01)

(52) U.S. Cl.
CPC ........ *C09K 11/77747* (2021.01); *C09K 11/02* (2013.01); *H01L 33/502* (2013.01)

(58) Field of Classification Search
CPC .. H01L 33/502; C09K 11/77747; C09K 11/02
See application file for complete search history.

(56) References Cited

U.S. PATENT DOCUMENTS

| 2015/0211712 A1* | 7/2015 | Yoshimura | ............ H01L 33/502 362/351 |
|---|---|---|---|
| 2020/0010760 A1 | 1/2020 | Ueda et al. | |
| 2020/0011507 A1 | 1/2020 | Nagasaki et al. | |

(Continued)

FOREIGN PATENT DOCUMENTS

| JP | 2015142046 A | 8/2015 |
|---|---|---|
| JP | 2018142531 A | 9/2018 |

(Continued)

*Primary Examiner* — C Melissa Koslow
(74) *Attorney, Agent, or Firm* — Hunton Andrews Kurth LLP

(57) ABSTRACT

The wavelength converter includes a support, and a wavelength conversion layer disposed on the support. The wavelength conversion layer contains a fluorescent layer containing a fluorescent material with a composition represented by formula (1) below, and having a thickness of from 5 μm to 155 μm. A ratio of a sum of cross-sectional areas of particles of the fluorescent material in a cross-section of the wavelength conversion layer orthogonal to a disposed surface of the wavelength conversion layer that is disposed on the support and including a full width of the wavelength conversion layer to a cross-sectional area of the cross-section of the wavelength conversion layer is from 5% to 40%. In the formula (1), $M^1$ is at least one selected from the rare earth elements other than La and Ce; a total amount of yttrium (Y), gadolinium (Gd), and lutetium (Lu) by mole with respect to a total amount of $M^1$ by mole is 90% or more; and p, q, r, and s satisfy $2.7 \leq p+q+r \leq 3.3$, $0 \leq r \leq 1.2$, $10 \leq s \leq 12$, and $0 < q \leq 1.2$.

$$La_p Ce_q M^1_r Si_6 N_s \qquad (1)$$

15 Claims, 5 Drawing Sheets

(56) References Cited

U.S. PATENT DOCUMENTS

2021/0102117 A1    4/2021  Hamada et al.
2021/0149097 A1    5/2021  Sugio et al.

FOREIGN PATENT DOCUMENTS

| JP | 2019020198 A | 2/2019 |
|----|--------------|--------|
| JP | 2019039992 A | 3/2019 |
| WO | 2018/159268 A1 | 9/2018 |
| WO | 2018/163830 A1 | 9/2018 |
| WO | 2018/198949 A1 | 11/2018 |
| WO | 2019/003927 A1 | 1/2019 |
| WO | 2019/044409 A1 | 3/2019 |
| WO | 2020/129358 A1 | 6/2020 |

* cited by examiner

50

50

WAVELENGTH CONVERTER AND LIGHT EMITTING DEVICE

CROSS-REFERENCE TO RELATED APPLICATION

This application claims priority to Japanese Patent Application No. 2020-165313, filed on Sep. 30, 2020 and Japanese Patent Application No. 2021-087486, filed on May 23, 2021, the entire disclosures of which are incorporated herein by reference.

BACKGROUND OF THE INVENTION

Technical Field

The present disclosure relates to a wavelength converter and a light emitting device.

Description of the Related Art

Some projectors display color images on a screen by projecting light emitted from a light source using micromirrors. In such projectors, a light source with a higher output power is to be used. For example, Japanese Unexamined Patent Application Publication No. 2019-039992 proposes a projector including a phosphor wheel including a disk-shaped substrate and a phosphor layer formed from a specific phosphor and a translucent inorganic material as a wavelength converter in a part of the light source. A light source with higher output power may include a wavelength converter that outputs light with a higher emission intensity.

SUMMARY

A first exemplary aspect of the present disclosure is a wavelength converter including a support, and a wavelength conversion layer disposed on the support and including a fluorescent material layer containing a fluorescent material with a composition represented by formula (1) below.

$$La_pCe_qM^1_rSi_6N_s \quad (1)$$

In the formula (1), $M^1$ is at least one selected from rare earth elements other than La and Ce; a total amount of yttrium (Y), gadolinium (Gd), and lutetium (Lu) by mole with respect to a total amount of $M^1$ by mole is 90% or more; and p, q, r, and s satisfy $2.7 \leq p+q+r \leq 3.3$, $0 \leq r \leq 1.2$, $10 \leq s \leq 12$, and $0 < q \leq 1.2$. In formula (1), p may satisfy $0.3 \leq p \leq 3.0$, and preferably satisfy $1.2 \leq p \leq 2.5$. The fluorescent material layer of the wavelength converter has a thickness of from 5 μm to 155 μm. A ratio of a sum of cross-sectional areas of particles of the fluorescent material in a cross-section of the wavelength conversion layer orthogonal to a disposed surface of the wavelength conversion layer that is disposed on the support and including a full width of the wavelength conversion layer to a cross-sectional area of the cross-section of the wavelength conversion layer may be from 5% to less than 40%.

A second exemplary aspect of the present disclosure is a light emitting device including the wavelength converter, and an emission element having a peak emission wavelength in the wavelength range of from 350 nm to 500 nm.

DETAILED DESCRIPTION

Figure 1A:
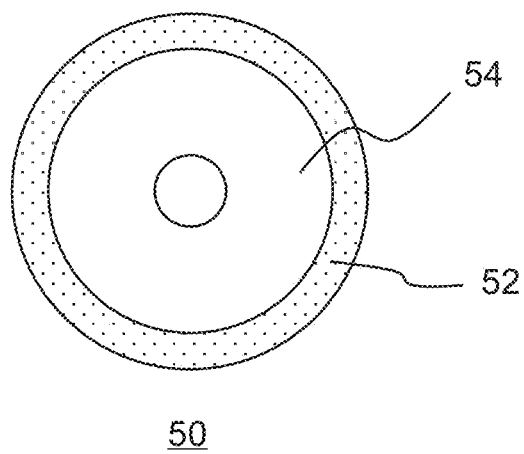
FIG. 1A is a schematic plan view of a wavelength converter as viewed from above a major surface of the wavelength converter.

As used herein, when a plurality of substances corresponding to a component are present in a composition, the amount of the component is the total amount of the corresponding substances present in the composition unless otherwise specified. Further, within the relevant numerical ranges described herein, the upper limit and the lower limit may be freely selected. The embodiments of the present invention will now be described in detail; however, the embodiments described below are mere examples of the wavelength converter and the light emitting device for embodying the technical concept of the present invention, and the present invention is not limited to the wavelength converter and the light emitting device described below. The members described in the claims are not limited to the members of the embodiments. Unless otherwise specified, the dimensions, materials, shapes, relative arrangement, and others of the structural members described in the embodiments are not intended to limit the scope of the present invention thereto, but are mere illustrative examples. In addition, sizes, relative positions, and others of the members shown in each drawing may be exaggerated for the sake of explanation. Further, the same names and signs indicate the same or comparable members in the description below, and thus may not be described in detail. In addition, a plurality of structural components of the present invention may be structured with the same member but may serve as a plurality of components, or conversely, the function of a single member may be shared by a plurality of members. Also, the description of some of examples or embodiments may be applied to other examples, embodiments, or others.

Wavelength Converter

The wavelength converter includes a support, and a wavelength conversion layer disposed on the support and including a fluorescent material layer containing a fluorescent material with a composition represented by, for example, formula (1) below. The fluorescent material layer has a thickness of from 5 μm to 155 μm. A ratio of a sum of cross-sectional areas of particles of the fluorescent material in a cross-section of the wavelength conversion layer orthogonal to a disposed surface of the wavelength conversion layer that is disposed on the support and including a full width of the wavelength conversion layer to a cross-sectional area of the cross-section of the wavelength conversion layer may be from 5% to less than 40%

$$La_pCe_qM^1_rSi_6N_s \quad (1)$$

In the formula (1), $M^1$ is at least one selected from rare earth elements other than La and Ce; a total amount of yttrium (Y), gadolinium (Gd), and lutetium (Lu) by mole with respect to a total amount of $M^1$ by mole is 90% or more; and p, q, r, and s satisfy $2.7 \leq p+q+r \leq 3.3$, $0 \leq r \leq 1.2$, $10 \leq s \leq 12$, and $0 < q \leq 1.2$. In formula (1), p may satisfy $0.3 \leq p \leq 3.0$, and preferably satisfy $1.2 \leq p \leq 2.5$.

The wavelength converter, which includes a fluorescent material layer containing a fluorescent material that has the specific composition and that is activated by cerium (Ce), and having a specific thickness, may emit light with a higher emission intensity when included in a light emitting device. Further, the emission intensity of output light also increases in proportion to the output of the emission element used, and thus exhibits superior emission properties with good linearity.

First Fluorescent Material

The peak emission wavelength of the fluorescent material (hereinafter also referred to as first fluorescent material) contained in the fluorescent material layer of the wavelength converter is adjustable in accordance with the intended wavelength region. For example, it is freely adjustable in the range reproducible by the fluorescent material having a composition represented by formula (1). The first fluorescent material may have a peak emission wavelength of, for example, from 480 run to 620 nm. To have a higher emission intensity particularly on the shorter wavelength side (e.g., green), the peak emission wavelength of the first fluorescent material may be from 480 nm 550 nm. The lower limit may preferably be 500 nm or more, 510 nm or more, or 520 nm or more, and the upper limit may preferably be 545 nm or less, 540 nm or less, or 530 nm or less. To have a higher emission intensity particularly on the longer wavelength side (e.g., red), the peak emission wavelength of the first fluorescent material may be from 530 nm to 620 nm. The lower limit may preferably be 540 nm or more, 550 nm or more, or 570 nm or more, and the upper limit may preferably be 610 nm or less, or 600 nm or less. To have a higher emission intensity from the shorter wavelength side to the longer wavelength side as a whole, the peak emission wavelength of the first fluorescent material may range, for example, from 520 nm to 580 nm. When the peak emission is in the wavelength range above, the emission intensity on the shorter wavelength side and the emission intensity on the longer wavelength side in the emission spectrum may be selected as appropriate. This enables improvement and control of color reproducibility.

For example, increasing the cerium content in the composition of the first fluorescent material may allow the first fluorescent material to have a greater emission intensity on the longer wavelength side. In this case, controlling the cerium content appropriately may reduce, for example, concentration quenching and lowering of temperature characteristics, and may reduce lowering of luminous efficiency under high power excitation. Also, partially replacing lanthanum with a rare earth element $M^1$ with a smaller ion radius, such as yttrium or gadolinium, may increase the emission intensity on the longer wavelength side. In this case, controlling the percentage of the substituting element appropriately may reduce, for example, distortion or defects of the crystal structure, which may prevent, for example, luminance saturation, or minimize reduction in linearity to the output of excitation light. In this manner, in the use of fluorescent materials under high power excitation, factors such as substituting elements and activating elements are also desirably considered to achieve intended color rendering and color reproduction properties.

The spectral half-width of the first fluorescent material is, for example, 100 nm or more, and preferably 110 nm or more, 115 nm or more, or 120 nm or more. The upper limit of the half-width is, for example, 150 nm or less, and preferably 140 nm or less, or 130 nm or less. When the half-width of the first fluorescent material is within die above range, the light emitting device tends to exhibit a higher emission intensity, and the emission intensity on the longer wavelength side in the emission spectrum tends to be greater.

The first fluorescent material may have a composition containing lanthanum (La), cerium (Ce), at least one of rare earth elements $M^1$ other than lanthanum (La) and cerium (Ce), silicon (Si), and nitrogen (N). Cerium may be contained in the composition of the first fluorescent material to serve as an activating element, and may be the emission center of the first fluorescent material. The rare earth element $M^1$ may be at least one selected from the group consisting of scandium (Sc), yttrium (Y), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The rare earth element $M^1$ may contain at least one selected from the group consisting of at least yttrium (Y), gadolinium (Gd), and lutetium (Lu), and preferably contains at least yttrium (Y). The total amount of yttrium (Y), gadolinium (Gd), and lutetium (Lu) by mole with respect to the total amount of the rare earth elements $M^1$ by mole in the first fluorescent material is, for example, 90% or more, preferably 95% or more, or 98% or more. The yttrium (Y) amount by mole with respect to the total rare earth elements $M^1$ by mole in the first fluorescent material is, for example, 90% or more, and preferably 95% or more, or 98% or more.

The first fluorescent material may have a composition where, when silicon is 6 mol, the ratio by mole of lanthanum may be from 0.3 to 3.0, preferably from 1.2 to 2.5; the ratio by mole of the total rare earth elements $M^1$ may be from 0 to 1.2, and preferably from 0.3 to 1.0; the ratio by mole of cerium may be greater than 0 and 1.2 or less, and preferably from 0.15 to 1.0; and the ratio by mole of nitrogen may be from 10 to 12, and preferably from 10.5 to 11.5. The first fluorescent material may have a composition represented by, for example, formula (1) below.

$$La_p Ce_q M^1_r Si_6 N_s \qquad (1)$$

In the formula (1) above, $M^1$ is at least one selected from rare earth elements other than La and Ce. $M^1$ may contain at least one selected from the group consisting of Y, Gd, and Lu, and preferably contains at least Y. The total content by mole of the at least one element selected from Y, Gd and Lu of $M^1$ is 90% or more, and preferably 95% or more. The Y content by mole of $M^1$ is 90% or more, and preferably 95% or more, p, q, r, and s satisfy $2.7 \leq p+q+r \leq 3.3$, $0 \leq r \leq 1.2$, $10 \leq s \leq 12$, and $0 < q \leq 1.2$, and preferably satisfy $2.9 \leq p+q+r \leq 3.1$, $0.3 \leq r \leq 1.0$, $10.5 \leq s \leq 11.5$, and $0 < q \leq 1.0$. p may satisfy $0.3 \leq p \leq 3.0$, and preferably satisfy $1.2 \leq p \leq 2.5$.

In the composition of the first fluorescent material, the rare earth element $M^1$ may be partially substituted by at least one selected from the group consisting of Group 2 elements, and preferably substituted by at least one selected from the group consisting of Mg and alkali earth metal elements. When the rare earth element $M^1$ is partially substituted by other elements than rare earth elements, the other element content by mole of the total rare earth elements $M^1$ is, for example, 10% or less, and preferably 5% or less, or 3% or less. The lower limit of the other element content by mole is, for example, 0.01% or more, and preferably 1% or more. When the rare earth element $M^1$ is partially substituted by other elements, the total yttrium (Y), gadolinium (Gd), and lutetium (Lu) content by mole of the total rare earth elements $M^1$ contained in the first fluorescent material may be, for example, 90% or more, and preferably 95% or more, or 98% or more. The yttrium (Y) content by mole of the total rare earth elements $M^1$ contained in the first fluorescent material may be, for example, 90% or more, and preferably 95% or more, or 98% or more.

In the composition of the first fluorescent material, silicon may be partially substituted by at least one element selected from the group consisting of boron (B), aluminium (Al), gallium (Ga), and germanium (Ge). When silicon is partially substituted by elements other than silicon, the other element content by mole (than silicon) of the total amount by mole of silicon and the other elements in the composition is, for example, 50% or less, and preferably 20% or less, or 10% or less. The lower limit of the other element content by mole (than silicon) is, for example, 0.01% or more, and preferably 5% or more. When silicon is partially substituted by elements other than silicon containing aluminium in the composition of the first fluorescent material, the total aluminium and silicon content by mole of the total amount by mole of silicon and the elements other than silicon is, for example, 90% or more, and preferably 95% or more, or 98% or more.

In the composition of the first fluorescent material, nitrogen may be partially substituted by an element other than nitrogen. Examples of the element other than nitrogen include oxygen, fluorine, and chlorine. The first fluorescent material may be surface-treated with, for example, an oxide, a hydroxide, a fluoride, or a chloride in a manner to replace nitrogen in its composition. When nitrogen is partially substituted by an element other than nitrogen, the other element content by mole (than nitrogen) of the total amount by mole of nitrogen and the elements other than nitrogen in the composition may be, for example, 10% or less, and preferably 5% or less, 3% or less, or 1% or less. The lower limit of the other element content by mole (than nitrogen) may be 0.01% or more, and preferably 0.1% or more, or 1% or more.

The particle size distribution of the first fluorescent material preferably has a single peak in view of emission intensity. The first fluorescent material may have a central particle diameter of, for example, from 1 μm to 100 μm, and preferably from 5 μm to 40 μm in view of emission intensity as well as workability in the production of the light emitting device. The lower limit of the central particle diameter of the first fluorescent material may be, for example, 7 μm or more, 10 μm or more, 12 μm or more, or 15 μm or more. The upper limit of the central particle diameter of the first fluorescent material may be, for example, 50 μm or less, 40 μm or less, 35 μm or less, 30 μm or less, 25 μm or less, or 22 μm or less. As used herein, the central particle diameter of the fluorescent material is a particle diameter corresponding to 50% from small particle diameter side in the volume-based cumulative particle size distribution.

The method for producing the first fluorescent material is not particularly limited, and may be appropriately selected from known means. For example, the first fluorescent material may be produced by the method described below. The elements to be contained in the composition of the fluorescent material in the form of a single substance, or in the form of an oxide, a carbonate, a nitride, a chloride, a fluoride, or a sulfide are weighed as raw materials in a manner to satisfy the predetermined composition ratio. To these raw materials, additives such as flux are further added as appropriate, which are then mixed using a mixer in a wet or dry manner. This promotes solid-phase reaction and forms particles with a uniform size. The mixer may be an industrially common ball mill or a grinder, such as a vibrational mill, a roll mill, or a jet mill. Pulverizing with a grinder also enables forming particles with a larger specific surface area. Also, to have particles with a specific surface area within a fixed range, classification may be carried out using a wet separator, such as an industrially common settling tank, a hydrocyclone, or a centrifuge; or a dry classifier, such as a cyclone and an air separator. The thus mixed raw materials are then placed into a SiC, quartz, alumina, or BN crucible, and subjected to calcination in an inert atmosphere such as argon or nitrogen, or a hydrogen-containing reducing atmosphere, or an oxidation atmosphere in the atmospheric air. Calcination is carried out at a predetermined temperature and time. The calcinated materials are then pulverized, dispersed, or filtered to obtain an intended fluorescent material powder. Solid-liquid separation may be carried out by an industrially common method, such as filtration, suction filtration, pressure filtration, centrifugation, or decantation. Drying may be carried out using industrially common equipment such as a vacuum-dryer, a hot air heating dryer, a conical dryer, or a rotary evaporator.

The fluorescent material layer may contain a single type of the first fluorescent material or a combination of two or more types of the first fluorescent materials. When the fluorescent material layer contains two or more of the first fluorescent materials, they may have different peak emission wavelengths, and may have different compositions. When the fluorescent material layer contains two or more of the first fluorescent materials, they may be contained in the same fluorescent material layer or in different fluorescent material layers. The different fluorescent material layers may be, for example, stacked and disposed on the support, or may be disposed in different regions on the support. The fluorescent material layer may contain a second fluorescent material in addition to the first fluorescent material. The second fluorescent material may be any fluorescent material if, for example, it has a different composition from the first fluorescent material, and is capable of toning output light. The amount of the first fluorescent material with respect to the total mass of the fluorescent materials forming the fluorescent material layer may be, for example, from 50 mass % to 100 mass %, and preferably from 70 mass % or more, 80 mass % or more, 90 mass % or more, or 95% or more.

The fluorescent material layer may contain a binder in addition to the first fluorescent material. The binder may be an inorganic material, such as glass, or an organic material, such as resin. The resin is preferably translucent resin, such as epoxy resin or silicone resin. When the wavelength converter contains a binder, the percentage of the binder in the wavelength conversion layer including the fluorescent material layer and the transparent layer may be, for example, from 15 mass % to 50 mass %, and preferably 20 mass % or more, or 25 mass % or more, and also preferably 45 mass % or less, or 40 mass % or less with respect to 100 mass %. A single binder may be used alone or two or more binders may be used in combination.

The fluorescent material layer has a thickness of from 5 μm to 155 μm. This enables the wavelength converter to emit light with a greater emission intensity. The lower limit of the thickness of the fluorescent material layer may preferably be 10 μm or more, 20 μm or more, 30 μm or more, or 40 μm or more. The upper limit of the thickness of the fluorescent material layer may preferably be 155 μm or less, 150 μm or less, 130 μm or less, 100 μm or less, 80 μm or less, 75 μm or less, or 70 μm or less. As used herein, the thickness of the fluorescent material layer is the thickness of the region containing the fluorescent material in the direction orthogonal to the support in a cross-section of the wavelength converter orthogonal to the support. When a plurality of the fluorescent material layers is stacked on the support, the sum of the thicknesses of the fluorescent material layers is the thickness of the fluorescent material layer.

More specifically, the thickness of the fluorescent material layer is measured in the manner described below. In an image of a cross-section of the fluorescent material layer orthogonal to the support and including the full width of the fluorescent material layer, a line perpendicular to the surface of the support is put up at a position half of the full width of the fluorescent material layer. The distance between the point of intersection of the perpendicular line with the interface between the support and the fluorescent material layer, and the point of intersection of the perpendicular line with the surface of the fluorescent material layer, or the interface between the fluorescent material layer and the optically transparent layer, is measured as the thickness of the fluorescent material layer. For example, when the fluorescent material layer having a predetermined width is disposed along the circumference of the disk-shaped support, the thickness of the fluorescent material layer may be measured on an image of a cross-section passing through the center of the disk and orthogonal to the support and including the full-width of the predetermined width of the fluorescent material layer having.

Figure 6:
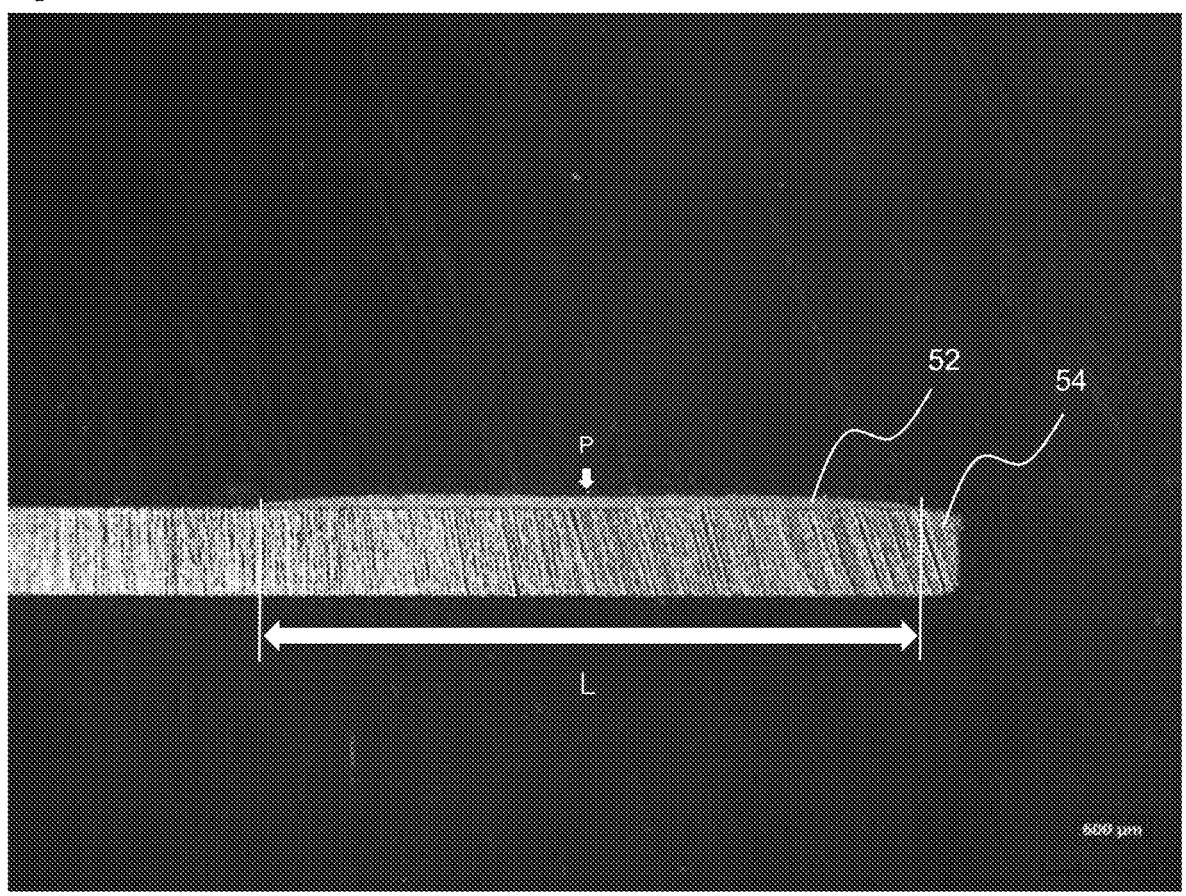
FIG. 6 is a partially enlarged cross-sectional view of a wavelength converter.
Figure 7:
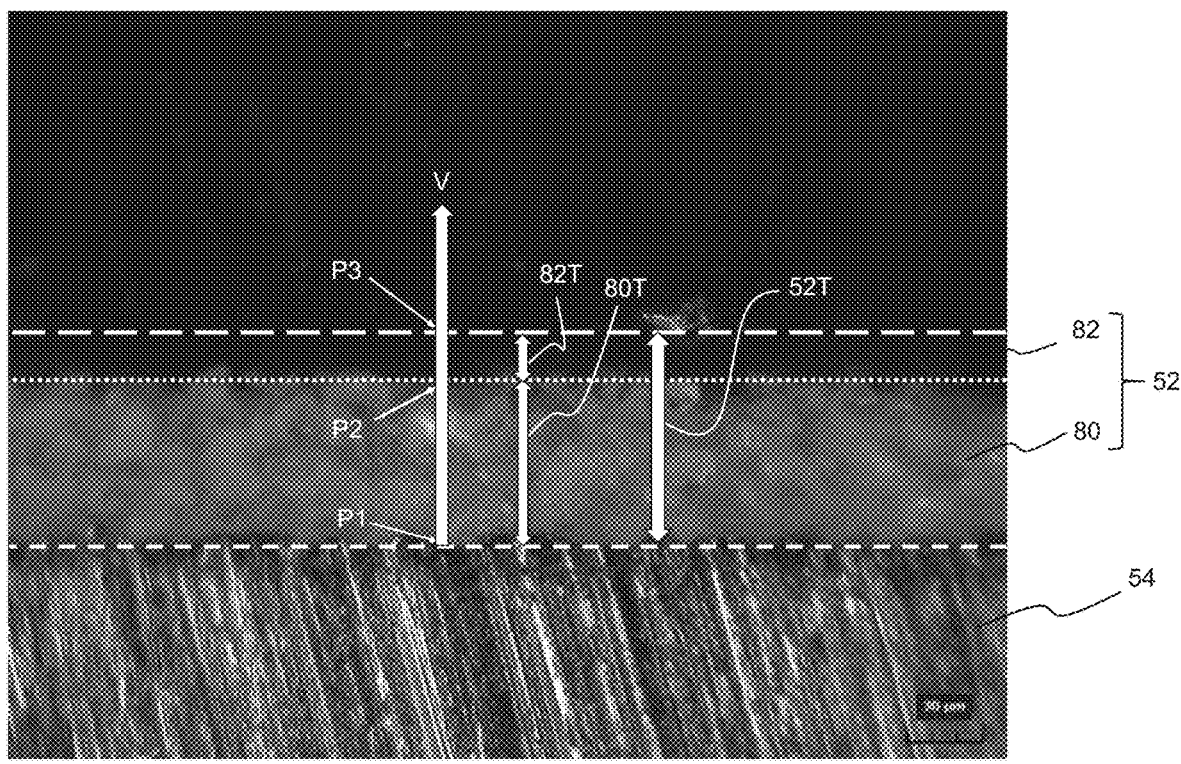
FIG. 7 is a partially enlarged cross-sectional view of an area around the measurement position P in FIG. 6.

The method of measuring the thickness of the wavelength conversion layer including the fluorescent material layer and the optically transparent layer as well as the thickness of the fluorescent material layer will now be described with reference to the drawings. FIG. 6 is a partially enlarged cross-sectional view of a wavelength converter including a disk-shaped support, on the circumference of which a fluorescent material layer having a predetermined width is disposed. FIG. 7 is a partially enlarged cross-sectional view of an area around the measurement position P of FIG. 6. As shown in FIG. 6, the thickness of the fluorescent material layer 80 arranged on the support 54 is measured at the measurement position P, which is positioned half of the full width L of the fluorescent material layer 80. As shown in FIG. 7, a perpendicular line V relative to the surface of the support 54 is put up at the measurement position P. The distance between the point of intersection P1 of the perpendicular line V with the interface between the support 54 and the fluorescent material layer 80, and the point of intersection P2 of the perpendicular line V with the interface between the fluorescent material layer 80 and the optically transparent layer 82 is measured as the thickness 80T of the fluorescent material layer 80. The distance between the point of intersection P1 of the perpendicular line V with the interface between the support 54 and the fluorescent material layer 80, and the point of intersection P3 of the perpendicular line V with the surface of the optically transparent layer 82 is measured as the thickness 52T of the wavelength conversion layer 52. The thickness 82T of the optically transparent layer 82 is calculated by subtracting the thickness 80T of the fluorescent material layer 80 from the thickness 52T of the wavelength conversion layer 52.

The wavelength converter including the fluorescent material layer containing the first fluorescent material and having a thinner thickness tends to emit light with a higher emission intensity. In other words, the wavelength converter may have a negative correlation between the thickness of the fluorescent material layer containing the first fluorescent material and the emission intensity of output light.

The first fluorescent material with a central particle diameter of, for example, from 5 μm to 40 μm, or from 10 μm to 35 μm may have a ratio of the thickness of the fluorescent material layer to the central particle diameter of the first fluorescent material (thickness/central particle diameter) of, for example, from 1 to 40, and preferably 20 or less, 10 or less, or 5 or less, and preferably 2 or more, or 2.2 or more.

Although the fluorescent material layer is disposed, for example, on one of the major surfaces of the support, the fluorescent material layer may be disposed on a partial region of the major surface, or the entire major surface, or approximately the entire major surface. The fluorescent material layer may be appropriately shaped in accordance with, for example, the purpose.

The fluorescent material layer may be a part of the wavelength conversion layer containing a fluorescent material and a binder. The wavelength conversion layer may include, for example, the fluorescent material layer disposed on the support, and an optically transparent layer containing a binder and disposed on the fluorescent material layer.

The wavelength conversion layer may further contain other components in addition to the fluorescent material and a resin. Examples of the other components include a filler, such as silica, barium titanate, titanium oxide, or aluminum oxide, a light stabilizer, and a coloring agent. When the wavelength converter contains other components, the amount is not particularly limited, and appropriately selected in accordance with, for example, the purpose. When, for example, the other component to be contained is a filler, the amount may be from 0.01 parts mass to 20 parts mass relative to 100 parts mass of the resin.

The wavelength conversion layer may have a thickness of for example, from 5 μm to 400 μm, and preferably from 30 μm to 150 μm, from 40 μm to 100 μm, or from 50 μm to 100 μm. The optically transparent layer included in the wavelength conversion layer has a thickness of, for example, 50 μm or less, and preferably 40 μm or less, or 30 μm or less. The lower limit of the thickness of the optically transparent layer may be, for example, greater than 0 μm, 5 μm or more, or 10 μm or more.

A ratio of a sum of cross-sectional areas of particles of the fluorescent material in a cross-section of the wavelength conversion layer orthogonal to a disposed surface of the wavelength conversion layer that is disposed on the support and including a full width of the wavelength conversion layer to a cross-sectional area of the cross-section of the wavelength conversion layer (hereinafter also referred to as "cross-sectional percentage") may be, for example, from 5% to less than 40%. The cross-sectional percentage may preferably be 7% or more, 10% or more, or 12% or more. Also, the cross-sectional percentage may be 35% or less, 30% or less, 28% or less, 25% or less, or 20% or less. With the cross-sectional percentage in the range above, the emission intensity of the output light tends to further increase. The total cross-sectional area of the fluorescent material is the sum of the cross-sectional areas of individual fluorescent material particles observable in the cross-section of the wavelength conversion layer.

The cross-sectional percentage is calculated, for example, in the manner as described below. In an image of a cross-section of the wavelength conversion layer orthogonal to the major surface of the support on which the wavelength conversion layer is disposed, and including the full width of the wavelength conversion layer, a line perpendicular to the surface of the support is put up at a position half of the full width of the wavelength conversion layer. The distance between the point of intersection of the perpendicular line with the interface between the support and the wavelength conversion layer, and the point of intersection of the perpendicular line with the surface of the wavelength conversion layer is measured as the thickness of the wavelength conversion layer. For example, when the wavelength conversion layer having a predetermined width is disposed along the circumference of the disk-shaped support, the thickness of the wavelength conversion layer may be measured in an image of a cross-section passing through the center of the disk and orthogonal to the support, and including the full-width of the wavelength conversion layer. Multiplying the full-width length of the wavelength conversion layer by the thickness of the wavelength conversion layer yields the cross-sectional area of the wavelength conversion layer.

The sum of the cross-sectional areas of the fluorescent material particles is calculated as the sum of the cross-sectional areas of individual fluorescent material particles observable in the cross-section of the wavelength conversion layer. The cross-sectional areas of individual fluorescent material particles in the cross-section of the wavelength conversion layer are measured as the cross-sectional areas of the fluorescent material particles recognizable in a backscattered electron image of the cross-section of the wavelength conversion layer obtained by using a scanning electron microscope (SEM). The cross-sectional percentage is calculated by dividing the calculated sum of the cross-sectional areas of the fluorescent material particles by the cross-sectional area of the wavelength conversion layer.

Support

The support may be a translucent member containing a translucent inorganic material, such as glass or alumina. The support when composed of a translucent member enables light incoming to the wavelength converter to be wavelength-converted and emitted from the other side of the surface into which the light has entered. At least the surface of the translucent support on which the wavelength conversion layer is formed or the other surface thereof may be roughened beforehand by, for example, etching or laser beam machining. This may reduce unevenness in emission on the emission side of the wavelength converter.

Also, the support may be a metal member containing a metal material, such as aluminium or copper. The support when composed of a metal member enables light incoming to the wavelength converter to be wavelength-converted and emitted from the same side as the surface into which the light has entered. This also improves heat dissipation from the fluorescent material, and improves luminous efficiency of the fluorescent material. The thickness of the support is not particularly limited, and may be appropriately selected in accordance with, for example, the purpose.

Method for Producing Wavelength Converter

A method for producing the wavelength converter will now be described. The wavelength converter is produced by a method including, for example, disposing the wavelength conversion layer containing a fluorescent material layer on one of the major surfaces of the support.

The wavelength conversion layer may be formed on one of the major surfaces of the support by, for example, a printing method. However, the method for forming the wavelength conversion layer is not limited to a printing method, and other known methods, such as compression molding, electrodeposition of a fluorescent material, or adhesion of a fluorescent material sheet, or a combination of a printing method and these methods may appropriately be selected. When formed by printing, the thickness of the wavelength conversion layer is set in the range described previously to reduce unevenness in emission of the wavelength converter and to improve workability in printing.

Printing Method

A fluorescent material paste containing a fluorescent material and a binder will be disposed on a surface of the support. The fluorescent material may be the first fluorescent material described above. The binder may be a resin, such as silicone resin, epoxy resin, phenol resin, or polyimide resin; or an inorganic binder, such as glass. The fluorescent material paste may contain a filler as appropriate. The filler may be at least one selected from the group consisting of silica, titanium oxide, barium titanate, aluminum oxide, and silicon oxide. The fluorescent material paste is disposed on the support by, for example, placing a screen printing plate on the support, putting the paste on the screen printing plate, and running a squeegee on the plate to transfer the fluorescent material paste through the plate onto the support with a predetermined thickness. This enables the fluorescent material paste to be arranged with an approximately uniform thickness.

In a state where a desired fluorescent material is distributed in the fluorescent material paste, the binder contained in the fluorescent material paste is cured to form a wavelength conversion layer. The binder may be cured by an appropriate method, such as drying, heating, or radiation of ultraviolet rays in accordance with the binder to be used.

Figure 1B:
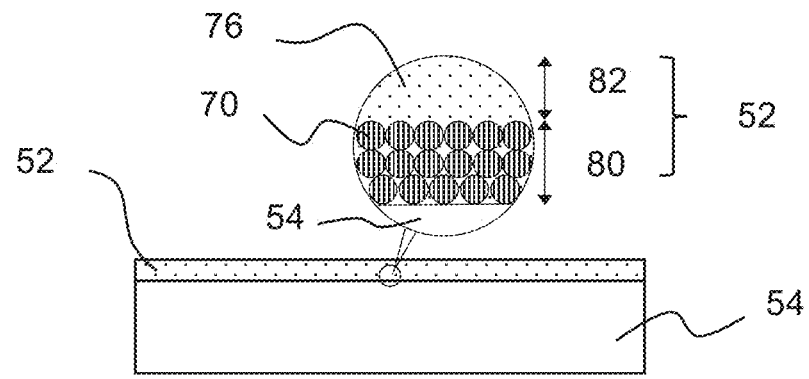
FIG. 1B is a schematic side view of the wavelength converter and a partially enlarged view thereof.

The wavelength converter may be produced by the method described above. FIGS. 1A and 1B schematically show an example of the resulting wavelength converter. FIG. 1A is a schematic plan view of a wavelength converter 50 as viewed from above of the major surface, and FIG. 1B is a schematic side view of the wavelength converter 50 and a partially enlarged view thereof. As shown in FIG. 1A, a wavelength conversion layer 52 is arranged along the circumference of a disk-shaped support 54. As shown in FIG. 1B, a fluorescent material layer 80 containing a fluorescent material 70, and an optically transparent layer 82 containing a resin 76 are stacked in this order on one of the major surfaces of the support 54 to form the wavelength conversion layer 52.

Light Emitting Device

The light emitting device includes a light emitting element, and a wavelength converter containing a fluorescent material to be excited by the light emitting element. The light emitting element has a peak emission wavelength in the wavelength range of, for example, from 350 nm to 500 nm. The fluorescent material layer included in the wavelength converter contains the first fluorescent material. The first fluorescent material may have a composition represented by, for example, formula (1). The fluorescent material layer has a thickness of from 5 μm to 155 μm.

The light emitting device, which includes a wavelength converter including a fluorescent material layer containing the first fluorescent material with a specific composition, and having a specific thickness, outputs light with a superior emission intensity. Also, the light emitting device has emission properties with good linearity to the output power of the light emitting element included in the light emitting device, and exhibits superior emission properties at high output. The details of the wavelength converter included in the light emitting device are as described above.

Light Emitting Element

The light emitting element may have a peak emission wavelength in the range of from 350 nm to 500 nm, and preferably from 380 nm to 470 nm or from 400 nm to 460 nm. Using a light emitting element having a peak emission wavelength in the range above as an excitation light source enables to form a light emitting device that emits mixed light from light emitted from the light emitting element and fluorescence from the fluorescent material. This further enables efficient use of part of light emitted from the light emitting element as part of light emitted from the light emitting device to the outside, achieving a light emitting device with high emission efficiency.

The light emitting element may have a spectral half-width of, for example, 30 nm or less. The light emitting element may preferably be a nitride semiconductor light emitting element. Using a semiconductor light emitting element as the excitation light source may form a light emitting device that is highly efficient with a high linearity of input to output, and that is stable by being resistant to mechanical impact. The light emitting element may be a light-emitting diode (LED) or a laser diode (LD). The light emitting element may be a single light emitting element or a combination of two or more.

Figure 2:
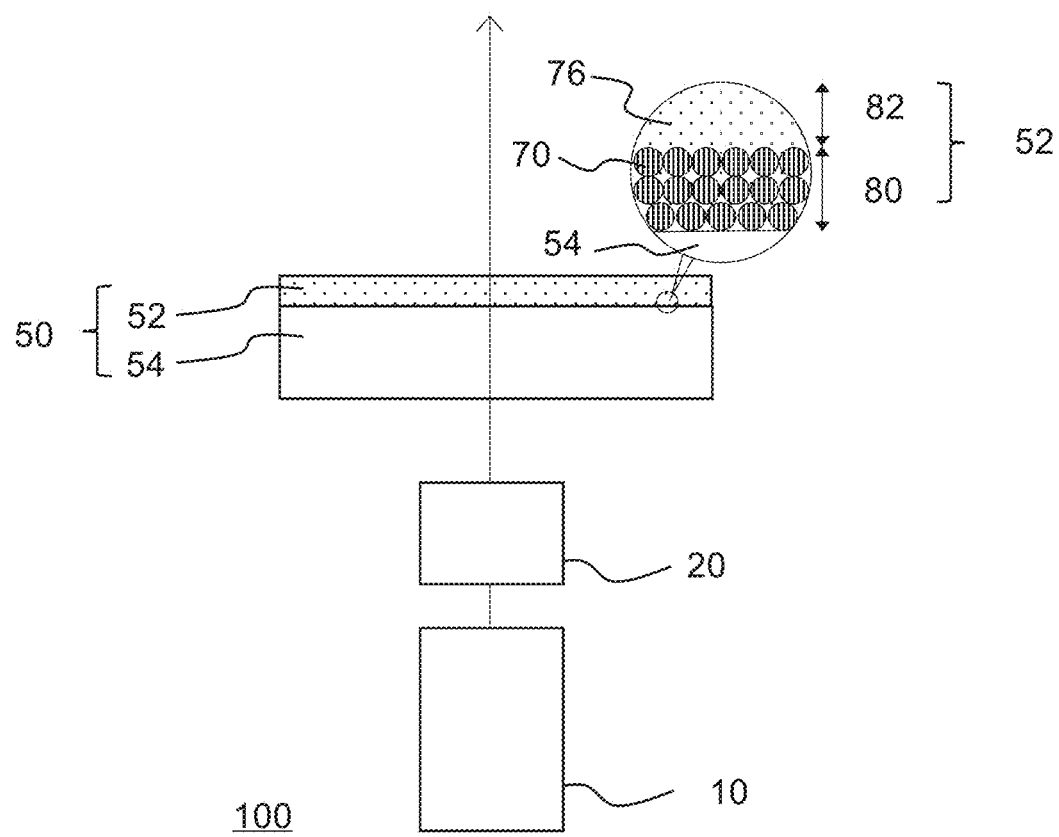
FIG. 2 is a schematic block diagram showing an exemplary light emitting device and a partially enlarged view thereof.

The light emitting element may have an output power expressed as a power density of light incoming to the wavelength converter of, for example, 0.5 W/mm$^2$ or more, and preferably 5 W/mm$^2$ or more, or 10 W/mm$^2$ or more. The upper limit of the output power of the light emitting element is, for example, 1000 W/mm$^2$ or less, and preferably 500 W/mm$^2$ or less, or 150 W/mm$^2$ or less. The light emitting element with an output power in the above range allows the wavelength converter to have further improved linearity to the output power of the light emitting element An exemplary structure of the light emitting device will now be described with reference to the drawings. FIG. 2 is a schematic block diagram showing an example structure of the light emitting device. The light emitting device 100 includes a light emitting element 10, an incidence optical system 20, and a wavelength converter 50. The wavelength converter 50 includes a support 54, and a wavelength conversion layer 52 arranged on the support 54 and including a fluorescent material layer 80 containing a fluorescent material 70, and an optically transparent layer 82 containing a resin 76. Light emitted from the light emitting element 10 passes through the incidence optical system 20, enters the wavelength converter 50 from the support 54, passes through the fluorescent material layer 80 containing the fluorescent material 70, and at least partially wavelength-converted by the fluorescent material 70. Alternatively, the wavelength-converted light and residual incidence light not having been wavelength-converted are emitted together from the wavelength converter 50. In this case, light emitted by the light emitting device is a mixed light of light from the light emitting element 10 and the wavelength-converted light.

Figure 3:
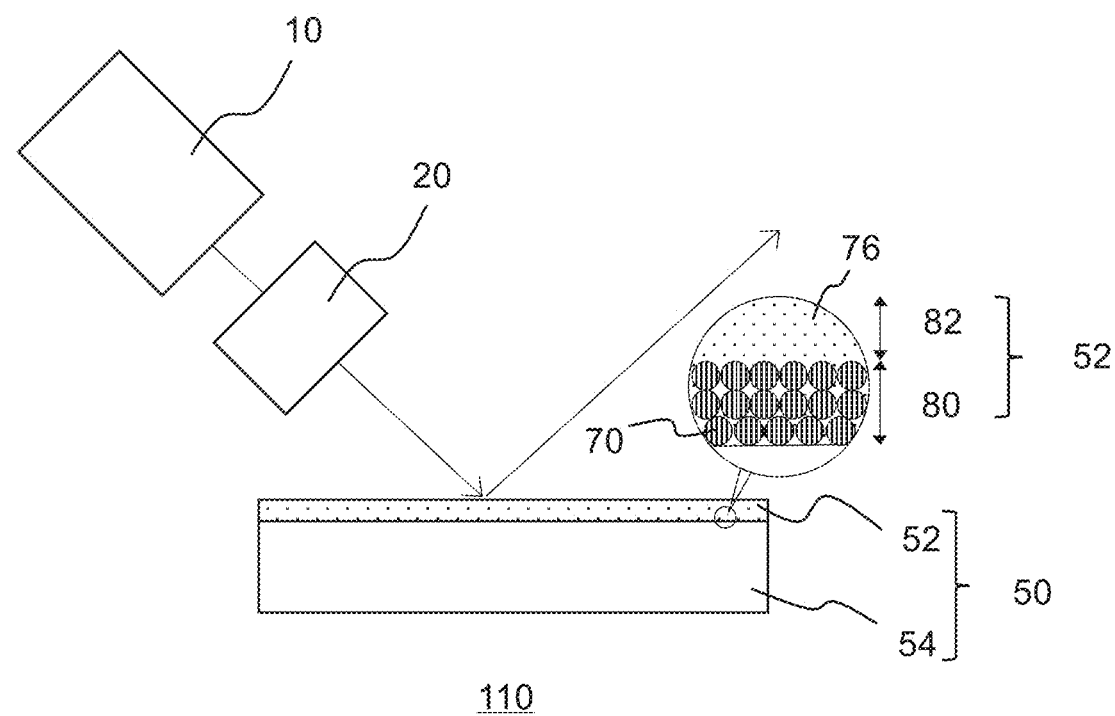
FIG. 3 is a schematic block diagram showing another exemplary light emitting device and a partially enlarged view thereof.

FIG. 3 is a schematic block diagram of another example of the light emitting device. The light emitting device 110 includes the light emitting element 10, the incidence optical system 20, and the wavelength converter 50. The wavelength converter 50 includes the support 54, and the wavelength conversion layer 52 arranged on the support 54 and including the fluorescent material layer 80 containing the fluorescent material 70, and the optically transparent layer 82 containing the resin 76, all of which are stacked in this order. Light emitted from the light emitting element 10 passes through the incidence optical system 20, enters the wavelength converter 50 from the wavelength conversion layer 52, and passes through the wavelength conversion layer 52, and light reflected is emitted from the wavelength conversion layer 52. At least part of light passing through the wavelength conversion layer 52 is wavelength-converted by the fluorescent material 70. Alternatively, the wavelength-converted light and residual incidence light not having been wavelength-converted are emitted together from the wavelength converter 50. In this case, light emitted from the light emitting device 110 is a mixed light of light from the light emitting element 10 and the wavelength-converted light.

Light Source Apparatus for Projectors

A light source apparatus for projectors includes the light emitting device described above. Including the light emitting device with superior emission properties under high output power enables to produce a projector with high output power.

The light emitting device including the wavelength converter according to the present disclosure may be used not only as a light source apparatus for projectors, but also as a light emitting device included in a light source for, for example, general lighting equipment, such as a ceiling light; special lighting equipment, such as spotlight, stadium lighting, and studio lighting; vehicle lighting equipment, such as headlight; projection equipment, such as head-up displays; light for endoscopes; imaging devices such as digital cameras, mobile phones, smartphones; and liquid crystal displays for personal computer monitors, televisions, portable information terminals (PDX), smartphones, tablet PCs, and mobile phones

EXAMPLES

The present invention will now be described in detail by means of Examples, but the present invention is not limited to these Examples.

Four nitride fluorescent materials each having a composition represented by $La_pCe_qY_rSi_6N_5$ were prepared as Fluorescent Materials 1 to 4. For the prepared fluorescent materials, chromaticity (x, y) were each measured using a quantum efficiency measurement system (QE-2000 by Otsuka Electronics). Also, for each of the fluorescent materials, the emission intensity (ENG) or the relative ENG when the emission intensity of Fluorescent Material 1 is 100% was obtained. Also, the central particle diameter (Dm) was each measured using a laser diffraction particle size analyzer (Master Sizer 3000 by Malvern). The central particle diameter of the nitride fluorescent material is a particle diameter (Dm: median diameter) when the volume cumulative frequency from the small particle diameter side in the particle diameter distribution reaches 50%.

TABLE 1

| | Composition | | | | Central particle diameter | Chromaticity | | Relative |
|---|---|---|---|---|---|---|---|---|
| | p | q | r | s | Dm(μm) | x | y | ENG(%) |
| Fluorescent material 1 | 1.93 | 0.54 | 0.51 | 10.78 | 15.6 | 0.482 | 0.511 | 100 |

TABLE 1-continued

|  | Composition | | | | Central particle diameter | Chromaticity | | Relative |
| --- | --- | --- | --- | --- | --- | --- | --- | --- |
|  | p | q | r | s | Dm(μm) | x | y | ENG(%) |
| Fluorescent material 2 | 1.92 | 0.54 | 0.52 | 10.96 | 12.1 | 0.480 | 0.513 | 102 |
| Fluorescent material 3 | 1.93 | 0.54 | 0.51 | 10.93 | 20.2 | 0.486 | 0.508 | 100 |
| Fluorescent material 4 | 2.81 | 0.17 | 0.00 | 11.08 | 20.7 | 0.427 | 0.553 | 99 |

Example 1

100 parts mass of silicone resin to serve as a binder and 135 parts mass of Fluorescent Material 1 were mixed to prepare a fluorescent material paste. For the support, a disk-shaped aluminium plate was used. On a major surface of the support, the fluorescent material paste was disposed using a printing method in a manner to have a predetermined width along the circumference of the aluminum plate, and thus an annular wavelength conversion layer was formed. This completed an intended wavelength converter.

The thicknesses of the fluorescent material layer, the optically transparent layer, and the wavelength conversion layer were measured in the manner described below. An image was captured of a cross-section passing through the center of and orthogonal to the disk-shaped support, and including the predetermined full width of the fluorescent material layer. In the cross-sectional image, a line was put up perpendicular to the surface of the support and passing through a point located at a half of the full width of the fluorescent material layer. The thickness of the fluorescent material layer was obtained by measuring the distance between the point of intersection of the perpendicular line and the interface between the support and the fluorescent material layer, and the point of intersection of the perpendicular line and the interface between the fluorescent material layer and the optically transparent layer. Also, the thickness of the wavelength conversion layer was obtained by measuring the distance between the point of intersection of the perpendicular line and the interface between the support and the fluorescent material layer, and the point of intersection of the perpendicular line and the surface of the wavelength conversion layer. The thickness of the optically transparent layer was obtained by subtracting the thickness of the fluorescent material layer from the thickness of the wavelength conversion layer.

Examples 2 to 15, and Comparative Example 1

Each wavelength converter was obtained in the same manner as in Example 1 except that the type and the amount of the fluorescent material were changed as shown in Table 2, and that the amount of the fluorescent material paste was changed to have a thickness as shown in Table 2.

TABLE 2

|  | Fluorescent material | | Thickness | | |
| --- | --- | --- | --- | --- | --- |
|  | Type | Amount (mass part) | Fluorescent material layer (μm) | Optically transparent layer (μm) | Wavelength conversion layer (μm) |
| Example 1 | Fluorescent material 1 | 135 | 50.3 | 17.8 | 68.1 |
| Example 2 | Fluorescent material 1 | 135 | 126.3 | 18.1 | 144.4 |
| Example 3 | Fluorescent material 1 | 167 | 43.5 | 20.3 | 63.8 |
| Example 4 | Fluorescent material 1 | 167 | 66.5 | 17.6 | 84.1 |
| Example 5 | Fluorescent material 1 | 167 | 119.6 | 23.7 | 143.3 |
| Example 6 | Fluorescent material 1 | 264 | 60.0 | 1.4 | 61.4 |
| Example 7 | Fluorescent material 1 | 264 | 86.5 | 1.4 | 87.9 |
| Example 8 | Fluorescent material 2 | 135 | 48.0 | 22.5 | 70.5 |
| Example 9 | Fluorescent material 2 | 167 | 67.4 | 5.4 | 72.8 |
| Example 10 | Fluorescent material 3 | 135 | 56.8 | 30.0 | 86.8 |
| Example 11 | Fluorescent material 3 | 167 | 50.1 | 18.0 | 68.1 |
| Example 12 | Fluorescent material 4 | 135 | 92.0 | 35.7 | 127.7 |
| Example 13 | Fluorescent material 4 | 167 | 63.7 | 27.2 | 90.9 |

TABLE 2-continued

|  | Fluorescent material | | Thickness | | |
|---|---|---|---|---|---|
|  | Type | Amount (mass part) | Fluorescent material layer (μm) | Optically transparent layer (μm) | Wavelength conversion layer (μm) |
| Example 14 | Fluorescent material 4 | 167 | 73.8 | 22.8 | 96.6 |
| Example 15 | Fluorescent material 4 | 167 | 112.9 | 3.9 | 116.8 |
| Comparative Example 1 | Fluorescent material 1 | 264 | 158.8 | 8.0 | 166.8 |

The resultant wavelength converter is schematically shown in FIGS. 1A and 1B. FIG. 1A is a schematic plan view of the wavelength converter 50 as viewed from above the major surface, and FIG. 1B is a schematic side view with a partially enlarged portion of the wavelength converter 50. As shown in FIG. 1A, the wavelength conversion layer 52 is annularly arranged with a predetermined width along the circumference of the disk-shaped support 54. As shown in FIG. 1B, the wavelength conversion layer 52, which is arranged on a major surface of the support 54, includes the fluorescent material layer 80 containing the fluorescent material 70, and the optically transparent layer 82 containing the resin 76.

Figure 4:
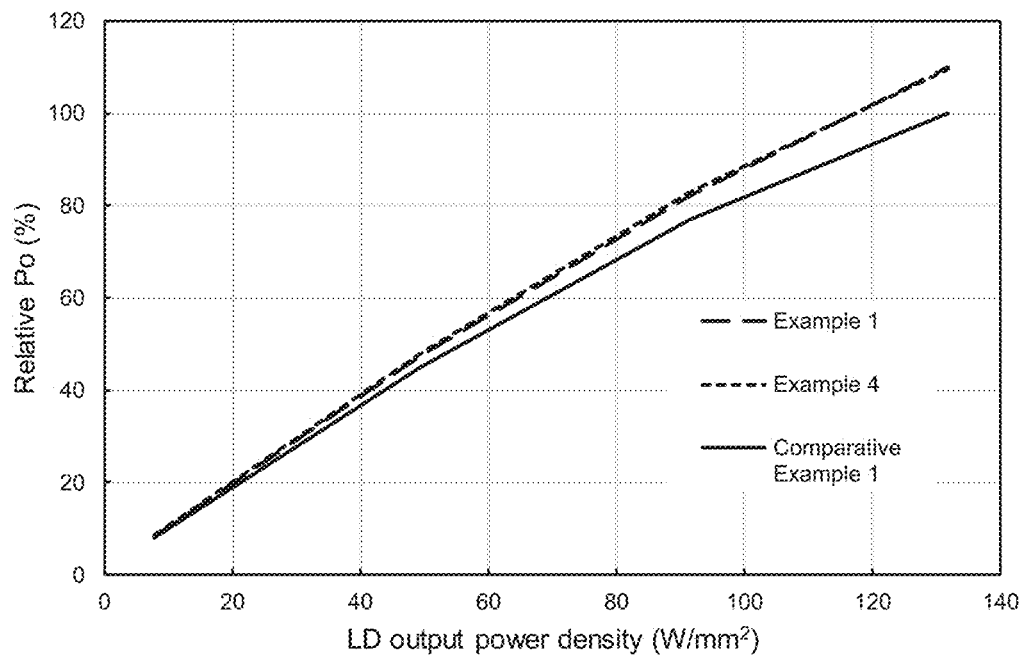
FIG. 4 is a graph showing changes in emission intensity of output light from wavelength converters relative to the power density of the excitation light source used.
Figure 5:
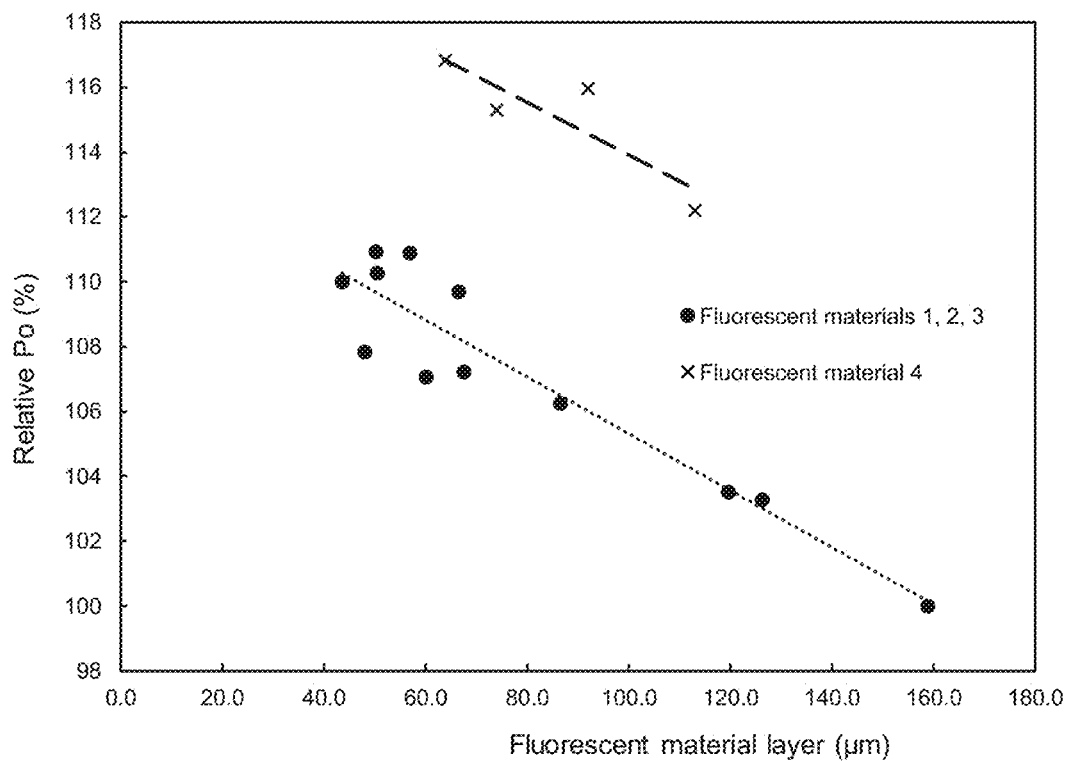
FIG. 5 is a graph showing changes in emission intensity of output light from wavelength converters relative to changes in thickness of the corresponding fluorescent material layers.

For each of the wavelength converter, the emission intensity was measured in the manner described below. The disk-shaped wavelength converter is fixed to a driving device, and the emission properties were measured while the driving device was being rotated at 7200 rpm. As the excitation light source for the wavelength converter, a laser diode (LD) with a peak emission wavelength of 455 nm was prepared. While changing the output power density (W/mm$^2$) of the laser diode in a stepwise manner as shown in Table 3, the emission intensity of output light from the wavelength converter for each output power density was measured in the range of from 470 nm to 800 nm. Each emission intensity is a relative Po (%) when the emission intensity of Comparative Example 1 for each output power density of the laser diode is 100.0%. Also, FIG. 4 shows changes in emission intensity (relative Po (%)) of output light from the wavelength converters of Examples 1 and 4 and Comparative Example 1 relative to the changes in output power density of the laser diode. Further, FIG. 5 shows changes in Po (%) relative to changes in thickness of the corresponding fluorescent material layers for the wavelength converters containing Fluorescent Materials 1, 2, and 3, which have similar compositions, and for the wavelength converter containing Fluorescent Material 4, when a laser diode (LD) with an output power density of 132 W/mm$^2$ is used.

TABLE 3

|  | Thickness of fluorescent material layer (μm) | LD output power density (W/mm$^2$) | | | |
|---|---|---|---|---|---|
|  |  | 8 | 49 | 92 | 132 |
| Example 1 | 50.3 | 105.0 | 105.7 | 106.8 | 110.3 |
| Example 2 | 126.3 | 100.7 | 101.8 | 102.6 | 103.3 |
| Example 3 | 43.5 | 103.8 | 105.2 | 106.2 | 110.0 |
| Example 4 | 66.5 | 105.8 | 106.8 | 107.7 | 109.7 |
| Example 5 | 119.6 | 102.2 | 102.8 | 103.7 | 103.5 |
| Example 6 | 60.0 | 102.7 | 103.6 | 104.6 | 107.0 |
| Example 7 | 86.5 | 103.7 | 104.2 | 104.9 | 106.3 |
| Example 8 | 48.0 | 103.1 | 104.3 | 104.9 | 107.8 |
| Example 9 | 67.4 | 103.6 | 103.6 | 104.3 | 107.2 |
| Example 10 | 56.8 | 104.0 | 104.6 | 106.3 | 110.9 |
| Example 11 | 50.1 | 104.6 | 105.1 | 106.8 | 110.9 |
| Example 12 | 92.0 | 102.7 | 106.1 | 109.0 | 116.0 |
| Example 13 | 63.7 | 103.4 | 106.6 | 109.6 | 116.9 |
| Example 14 | 73.8 | 101.9 | 105.2 | 108.1 | 115.3 |
| Example 15 | 112.9 | 100.7 | 103.7 | 106.0 | 112.2 |
| Comparative Example 1 | 158.8 | 100.0 | 100.0 | 100.0 | 100.0 |

As shown in Table 3, the wavelength converters of Examples, all of which include fluorescent material layers with a smaller thickness than the fluorescent material layer of Comparative Example 1, exhibit a greater relative Po at each measured output power. Also, as shown in FIG. 4, the wavelength converters of Examples 1 and 4 each emit light with an emission intensity increasing with the increase in output power density of the laser diode. This demonstrates that they have emission properties with good linearity. As shown in FIG. 5, the wavelength converters each including a fluorescent material layer with a smaller thickness emit light with a greater emission intensity.

Of the wavelength converters obtained above, for typical ones, the percentage (cross-sectional percentage) of the sum of the cross-sectional areas of fluorescent material particles to the cross-sectional area of the wavelength conversion layer in a cross-section of the wavelength conversion layer orthogonal to a disposed surface of the wavelength conversion layer that is disposed on the support and including a full width of the wavelength conversion layer was each evaluated in the manner described below. The results are shown in Table 4.

Evaluation of Cross-Sectional Percentage

An image of a cross-section of each of these wavelength conversion layers was captured by a scanning electron microscope (SEM), and analyzed using image analysis software (ImageJ). The fluorescent material particles whose contours are recognizable in the cross-sectional SEM image were binalized. The binalized cross-sectional areas of the fluorescent material were added up to obtain the total cross-sectional area of the fluorescent material, which was divided by the cross-sectional area of the cross-section of the wavelength conversion layer to obtain the cross-sectional percentage.

TABLE 4

| | Fluorescent material | | Thickness | | | Cross-sectional percentage (%) |
|---|---|---|---|---|---|---|
| | Type | Amount (mass part) | Fluorescent material layer (μm) | Optically transparent layer (μm) | Wavelength conversion layer (μm) | |
| Example 1 | Fluorescent material 1 | 135 | 50.3 | 17.8 | 68.1 | 13.8 |
| Example 4 | Fluorescent material 1 | 167 | 66.5 | 17.6 | 84.1 | 15.5 |
| Example 6 | Fluorescent material 1 | 264 | 60.0 | 1.4 | 61.4 | 20.3 |
| Comparative Example 1 | Fluorescent material 1 | 264 | 158.8 | 8.0 | 166.8 | 12.6 |
| Example 9 | Fluorescent material 2 | 167 | 67.4 | 5.4 | 72.8 | 16.3 |
| Example 11 | Fluorescent material 3 | 167 | 50.1 | 18.0 | 68.1 | 11.9 |
| Example 12 | Fluorescent material 4 | 135 | 92.0 | 35.7 | 127.7 | 14.6 |
| Example 13 | Fluorescent material 4 | 167 | 63.7 | 27.2 | 90.9 | 15.3 |

Examples 16 to 20

Wavelength converters of Examples 16 to 20 were each obtained in the same manner as in Example 1 using Fluorescent Material 1 except that the amount of Fluorescent Material 1 was changed as shown in Table 4, and that the amount of the fluorescent material paste was changed to have the thickness each shown in Table 5.

For each of the resultant wavelength converters, the cross-sectional percentage was evaluated in the same manner as described above. The results are shown in Table 5.

TABLE 5

| | Fluorescent material Amount (mass part) | Fluorescent material layer (μm) | Thickness | | Cross-sectional percentage (%) |
|---|---|---|---|---|---|
| | | | Optically transparent layer (μm) | Wavelength conversion layer (μm) | |
| Example 16 | 300 | 66.7 | 0.0 | 66.7 | 26.4 |
| Example 17 | 300 | 113.6 | 0.0 | 113.6 | 26.4 |
| Example 18 | 167 | 94.9 | 18.6 | 113.5 | 13.6 |
| Example 19 | 167 | 106.0 | 14.0 | 120.0 | 15.2 |
| Example 20 | 167 | 150.0 | 24.1 | 174.1 | 14.6 |

For each of the wavelength converters obtained in Examples 16 to 20, the emission intensity was measured in the same manner as described above. Each emission intensity is expressed as a relative Po (%) when the emission intensity of Example 17 for each output power density of the laser diode is 100.0%.

TABLE 6

| | Thickness of fluorescent material layer (μm) | LD output power density (W/mm$^2$) | | | |
|---|---|---|---|---|---|
| | | 8 | 49 | 92 | 132 |
| Example 16 | 66.7 | 94.5 | 95.6 | 96.6 | 103.1 |
| Example 17 | 113.6 | 100.0 | 100.0 | 100.0 | 100.0 |
| Example 18 | 94.9 | 119.0 | 118.6 | 119.7 | 127.4 |
| Example 19 | 106.0 | 117.4 | 116.5 | 116.6 | 121.3 |
| Example 20 | 150.0 | 116.7 | 115.5 | 114.6 | 108.0 |

As shown in Table 5, in comparison with Examples 16 and 17, Examples 18 to 20, which have smaller cross-sectional percentages, have a greater relative Po for each output power than those of Examples 16 and 17. This indicates that the fluorescent material layer with a thickness not greater than the predetermined value and a smaller cross-sectional percentage has a greater relative Po for each output power.

The results shown above indicate that a wavelength conversion layer having a less amount of fluorescent material may be less affected by heat and maintain emission properties even under high output power. Typically, electrons in the ground state of a fluorescent material are excited by light energy received from a light source, transit from the ground state to an excited state, and emit extra energy as light emission when returning to the ground state. At this time, light energy from the light source is rarely completely (100%) converted into the light emission, and is partially transit-emitted to be convert into heat from the excited state. In other words, more conversion into heat generates more heat in the wavelength conversion layer. Since a fluorescent material may thus become not only an emission source but also a heat source, heat generated by an excessive amount of fluorescent material in the wavelength conversion layer may decrease the emission intensity.

The evaluation results of Examples 1 to 15 demonstrate that a fluorescent material layer with a smaller thickness may be less affected by heat from the fluorescent material, and maintain a high relative Po under high output power of the light source. The evaluation results of Examples 16 to 20 demonstrate that reducing the thickness of the fluorescent material layer as well as the cross-sectional percentage enables more high relative Po. A smaller cross-sectional percentage may mean, for example, less dense fluorescent material particles in the wavelength conversion layer. For example, Examples 18 to 20, which have smaller cross-sectional percentages than Examples 16 and 17, each have a more high relative Po. As stated above, a fluorescent material layer with a smaller thickness, or a smaller cross-sectional percentage, or both may achieve a desirable relative Po.

The fluorescent material layer is to have a thickness that allows it to be efficiently excited by light from the excitation light source. The fluorescent material layer is to have a certain thickness because emission by self-absorption among particles is also caused by emission of the fluorescent material when excited by an excitation light source. However, a fluorescent material layer with a greater thickness may be more affected by heat emitted by the excitation light source. In particular, when used with a laser diode or an emission diode at high output power, heat from the wavelength converter is to be effectively released. A fluorescent material layer including a binder such as silicone resin may dissipate less heat. In that case, the fluorescent material may be affected by heat, and may have a smaller emission efficiency. Further, the fluorescent material itself may also act as a heat source since the excited energy partially turns into heat. Thus, the fluorescent material layer ideally has a minimum thickness that allows the excitation light to be efficiently wavelength-converted. The wavelength converter of the present Example prepared in consideration of these factors may emit light with a further greater emission intensity by sufficiently absorbing excitation light while being less affected by heat.

The wavelength converter or the light emitting device according to the present disclosure may be used as a wavelength converter or a light emitting device included in a light source for, for example, general lighting equipment, such as a ceiling light; special lighting equipment, such as spotlight, stadium lighting, and studio lighting; vehicle lighting equipment, such as headlight; projection equipment, such as projectors and head-up displays; light for endoscopes; imaging devices, such as digital cameras, mobile phones, and smartphones; liquid crystal displays for personal computer monitors, televisions, portable information terminals (PDX), smartphones, tablet PCs, and mobile phones.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A wavelength converter, comprising:
a support; and
a wavelength conversion layer disposed on the support, the wavelength conversion layer including a fluorescent material layer containing a fluorescent material with a composition represented by formula (1) below, $$La_pCe_qM^1_rSi_6N_s \quad (1)$$

wherein $M^1$ is at least one selected from rare earth elements other than La and Ce; a total amount of yttrium (Y), gadolinium (Gd), and lutetium (Lu) by mole with respect to a total amount of $M^1$ by mole is 90% or more; and p, q, r, and s satisfy $2.7 \leq p+q+r \leq 3.3$, $0 \leq r \leq 1.2$, $10 \leq s \leq 12$, and $0 < q \leq 1.2$,
wherein the fluorescent material layer has a thickness of from 5 μm to 155 μm, and a ratio of a sum of cross-sectional areas of particles of the fluorescent material in a cross-section of the wavelength conversion layer orthogonal to a disposed surface of the wavelength conversion layer that is disposed on the support and including a full width of the wavelength conversion layer to a cross-sectional area of the cross-section of the wavelength conversion layer is from 5% to less than 40%.

2. The wavelength converter according to claim 1, wherein in formula (1), p satisfies $0.3 \leq p \leq 3.0$.

3. The wavelength converter according to claim 1, wherein an amount of Y by mole with respect to the total amount of $M^1$ by mole is 90% or more in the formula (1).

4. The wavelength converter according to claim 1, wherein the fluorescent material layer has a thickness of from 5 μm to 75 μm.

5. The wavelength converter according to claim 1, wherein the ratio of the sum of the cross-sectional areas of the particles of the fluorescent material to the cross-sectional area of the cross-section of the wavelength conversion layer is from 7% to 35%.

6. The wavelength converter according to claim 1, wherein the fluorescent material has a central particle diameter of from 5 μm to 40 μm.

7. The wavelength converter according to claim 6, wherein an amount of Y by mole with respect to the total amount of $M^1$ by mole is 90% or more in the formula (1).

8. The wavelength converter according to claim 6, wherein a ratio of the thickness of the fluorescent material layer to the central particle diameter of the fluorescent material is in a range of from 1 to 40.

9. The wavelength converter according to claim 1, wherein the wavelength conversion layer further comprises a binder, and a content of the binder is in a range of from 15 mass % to 50 mass % with respect to 100 mass %.

10. The wavelength converter according to claim 1, wherein a thickness of the wavelength conversion layer is in a range of from 5 μm to 400 μm.

11. The wavelength converter according to claim 1, wherein the wavelength conversion layer further includes an optically transparent layer and a thickness of the optically transparent layer is in a range of from 5 μm to 50 μm.

12. A light emitting device, comprising:
    the wavelength converter according to claim 1; and
    a light emitting element having a peak emission wavelength in a range of from 350 nm to 500 nm.

13. The light emitting device according to claim 12, wherein the light emitting element includes a laser diode.

14. The light emitting device according to claim 12, wherein light emitted from the light emitting element enters the wavelength converter from the support, passes through the fluorescent material layer, and is at least partially wavelength-converted by the fluorescent material.

15. The light emitting device according to claim 12, wherein light emitted from the light emitting element enters the wavelength converter from the wavelength conversion layer, and passes through the wavelength conversion layer, and light reflected is emitted from the wavelength conversion layer.

* * * * *